(12) United States Patent
de Rochemont (10) Patent No.: US 7,763,917 B2
(45) Date of Patent: Jul. 27, 2010

(54) PHOTOVOLTAIC DEVICES WITH SILICON DIOXIDE ENCAPSULATION LAYER AND METHOD TO MAKE SAME

(76) Inventor: L. Pierre de Rochemont, 12501 Tech Ridge Blvd., Suite 628, Austin, TX (US) 78753

( * ) Notice: Subject to any disclaimer, the term of this patent is extended or adjusted under 35 U.S.C. 154(b) by 98 days.

(21) Appl. No.: 11/626,840

(22) Filed: Jan. 24, 2007

(65) Prior Publication Data
US 2007/0170535 A1    Jul. 26, 2007

Related U.S. Application Data

(60) Provisional application No. 60/761,725, filed on Jan. 24, 2006.

(51) Int. Cl.
*H01L 31/062* (2006.01)
*H01L 31/048* (2006.01)

(52) U.S. Cl. .............. 257/290; 257/291; 257/292; 257/434; 257/444; 257/446; 257/461; 257/E27.124; 257/E27.125; 257/E27.133; 136/244; 136/249; 136/251; 438/66; 438/80; 438/98

(58) Field of Classification Search .......... 257/291, 257/434, 446, 461; 136/244, 251; 438/66, 438/80, 98
See application file for complete search history.

(56) References Cited

U.S. PATENT DOCUMENTS

| | | | |
|---|---|---|---|
| 4,859,492 A * | 8/1989 | Rogers et al. | 427/583 |
| 5,084,749 A * | 1/1992 | Losee et al. | 257/222 |
| 5,456,945 A | 10/1995 | McMillan et al. | |
| 5,540,772 A | 7/1996 | McMillan et al. | |
| 5,614,252 A | 3/1997 | McMillan et al. | |
| 5,707,459 A * | 1/1998 | Itoyama et al. | 136/251 |
| 5,707,715 A | 1/1998 | deRochemont et al. | |
| 5,759,923 A | 6/1998 | McMillan et al. | |
| 5,888,583 A | 3/1999 | McMillan et al. | |
| 6,027,826 A | 2/2000 | deRochemont et al. | |
| 6,143,432 A | 11/2000 | de Rochemont et al. | |

(Continued)

OTHER PUBLICATIONS

R. Khun et al., "Characterization of Novel Mono- and Bifacially Active Semi-Transparent Crystalline Silicon Solar Cells", IEEE Transactions on Electron Devices, 46(10), Oct. 1999, p. 2013-2017.

*Primary Examiner*—Dao H Nguyen
(74) *Attorney, Agent, or Firm*—Burns & Levinson LLP; Jacob N. Erlich; David W. Gomes (57) ABSTRACT

A photovoltaic device and method of manufacture provides a P-N junction formed between doped semiconductor materials and adapted to produce photovoltaic current in response to radiant energy reaching the P-N junction, and a silicon dioxide protective window layer located in proximity to doped semiconductor material and adapted to allow radiant energy to pass therethrough en route to the P-N junction, the protective layer including a high optical transparency layer of amorphous silica, having a silicon dioxide chemistry greater than 75 molar percent (75 mol %). A photovoltaic window provides a planar photovoltaic device being at least semi-transparent; and a pair of protective window layers sandwiched around the planar photovoltaic device and adapted to allow radiant energy to reach the photovoltaic device through both protective window layers, wherein at least one protective window layer is a high optical transparency layer of amorphous silica, having a silicon dioxide chemistry greater than 75 molar percent (75 mol %).

7 Claims, 10 Drawing Sheets

U.S. PATENT DOCUMENTS

| | | |
|---|---|---|
| 6,323,549 B1 | 11/2001 | deRochemont et al. |
| 6,670,497 B2 * | 12/2003 | Tashino et al. ................ 560/76 |
| 6,742,249 B2 | 6/2004 | deRochemont et al. |
| 6,919,119 B2 | 7/2005 | Kalkan et al. |
| 7,047,637 B2 | 5/2006 | deRochemont et al. |
| 2002/0092472 A1 | 7/2002 | Hayashi et al. |
| 2003/0221621 A1 * | 12/2003 | Pokharna et al. ............ 118/722 |
| 2004/0084080 A1 | 5/2004 | Sager et al. |
| 2004/0118448 A1 | 6/2004 | Scher et al. |

* cited by examiner

FIG. 1

TOP VIEW
FIG. 2A

SIDE VIEW
FIG. 2B

SIDE VIEW
FIG. 5A

TOP VIEW
FIG. 5B

SIDE VIEW
FIG. 5C

PHOTOVOLTAIC DEVICES WITH SILICON DIOXIDE ENCAPSULATION LAYER AND METHOD TO MAKE SAME

RELATED APPLICATIONS

The present application claims priority from U.S. Provisional Patent Application 60/761,725.

FIELD OF THE INVENTION

The present invention relates to photovoltaic devices having a high-transparency silicon dioxide environmental enclosure and the method to make the same.

BACKGROUND

U.S. Pat. No. 6,027,826 to de Rochemont, et al., disclose articles and methods to form oxide ceramic on metal substrates to form laminate, filament and wire metal-ceramic composite structures using liquid aerosol spray techniques. U.S. Pat. Nos. 6,323,549 and 6,742,249 to de Rochemont, et al., disclose articles that comprise, and methods to construct, an interconnect structure that electrically contacts a semiconductor chip to a larger system using at least one discrete wire that is embedded in silica ceramic, as well as methods to embed passive components within said interconnect structure. U.S. Pat. Nos. 5,707,715 and 6,143,432 to de Rochemont, et al., (the '715 and '432 patents), disclose articles and methods to relieve thermally-induced mechanical stress in metal-ceramic circuit boards and metal-ceramic and ceramic-ceramic composite structures. The contents of each of these references are incorporated herein by reference as if laid out in their entirety.

McMillan et al. (U.S. Pat. Nos. 5,456,945; 5,540,772; 5,614,252; 5,759,923; 5,888,583, hereinafter referred collectively as McMillan et al.) disclose methods and apparatus for disposing liquid precursor films by flowing a mist of liquid metalorganic precursors over a substrate contained within a deposition chamber, where both the substrate and the deposition chamber are held at substantially ambient temperatures. Although this art instructs the use of liquid precursors comprising wet chemistry techniques that include carboxylic acid and alkloxide chemistries to form silicon dioxide and other oxide dielectrics, such as barium strontium titanate (BST), on integrated circuit substrates, the inventors repeatedly advise that heating the deposition chamber and substrate during the deposition process leads to inferior quality films. Under McMillan et al., ambient temperatures must be maintained within the deposition chamber, which may alternatively be held under vacuum or at atmospheric pressure during the deposition process. General ambient temperatures are clearly defined as ranging between −50° C. and 100° C., preferably ranging between 15° C. and 40° C. The initial deposit is a liquid film that is subsequently dried and treated to form a solid oxide layer. Treatment of the liquid film is defined as meaning one or any combination of the following process steps: exposure to vacuum, application of ultraviolet (UV) radiation, electrical poling, drying, heating and annealing. Ultraviolet radiation is applied to the mist during the deposition process to accelerate dissociation of the precursor flowing over the substrate and electrical poling is believed to increase the dwell time of the precursor mist over the substrate. Solvents contained within the liquid film are primarily extracted from the deposit using vacuum techniques. Furthermore, in U.S. Pat. No. 5,759,923, McMillan et al. only instruct on a need for water-free alkoxide chemistries when depositing silicon dioxide materials, suggesting that silicon carboxylic acid chemistries can be exposed to water-containing chemical species or atmospheric environments having relatively humidity, such as ambient air. Additional prior art that instructs the application of a liquid film to a substrate by means of an aerosol spray, followed by solvent extraction and subsequent treatment is cited by Hayashi et al. (U.S. Pub. No. 2002/0092472 A1).

R. Khun et al., "Charcterization of Novel Mono- and Bifacially Active Semi-Transparent Crystalline Silicon Solar Cells", IEEE Transactions on Electron Devices, 46(10), October 1999, p. 2013-2017, disclose the use of mechanical saws to cut groves into a silicon photovoltaic device to render it semi-transparent for the purpose of developing architectural solar cell devices. Kalkan et al, U.S. Pat. No. 6,919,119, and Sager et al, U.S. Pub. No. US/2004/0084080 A1, disclose the use nano-architected (corrugated) surface topologies to increase the electrically active surface area per unit volume of photovoltaic device media. Scher et al, U.S. Pub. No. US/2004/0118404 disclose the use of nano-particle P-N junctions embedded in organic media or assembled within a void existing between two electrodes to form solar cell devices. Nano-particle P-N junction embodiments comprising semiconductor compounds defined as Group II-VI, Group III-V, and Group IV semiconductors are incorporated herein by way of reference.

SUMMARY OF THE INVENTION

In one embodiment of the present invention, a photovoltaic device comprises a P-N junction formed between doped semiconductor materials and adapted to produce photovoltaic current in response to radiant energy reaching the P-N junction, and a silicon dioxide protective window layer located in proximity to doped semiconductor material and adapted to allow radiant energy to pass therethrough en route to the P-N junction the protective layer including a high optical transparency layer of amorphous silica, having a silicon dioxide chemistry greater than 75 molar percent (75 mol %).

The protective window layer may include a high optical transparency layer of amorphous silica having a silicon dioxide chemistry greater than or equal to 90 mol %. The protective window layer may consist of a high optical transparency layer of amorphous silica having a silicon dioxide chemistry greater than or equal to, and, more preferably greater than 99 mol %.

The protective window layer may be formed on one or more of the doped semiconductor materials, or the doped semiconductor materials are formed on the protective window layer.

In another embodiment of the present invention, a photovoltaic window comprises a planar photovoltaic device being at least semi-transparent; and a pair of protective window layers sandwiched around the planar photovoltaic device and adapted to allow radiant energy to reach the photovoltaic device through both protective window layers, wherein at least one protective window layer is a high optical transparency layer of amorphous silica, having a silicon dioxide chemistry greater than 75 molar percent (75 mol %).

The at least one protective window layer may include a high optical transparency layer of amorphous silica having a silicon dioxide chemistry greater than or equal to 90 mol %.

The at least one protective window layer may include a high optical transparency layer of amorphous silica consisting of a silicon dioxide chemistry greater than or equal to 99 mol %.

In yet another embodiment of the present invention, a method for fabricating a photovoltaic device, comprises the steps of forming a P-N junction between doped semiconductor materials adapted to produce photovoltaic current in response to radiant energy reaching the P-N junction; and forming a silicon dioxide protective window layer in conjunction with the doped semiconductor material and adapted to allow radiant energy to pass therethrough en route to the P-N junction, the protective window layer including a high optical transparency layer of amorphous silica, having a silicon dioxide chemistry greater than 75 molar percent.

The step of forming a silicon dioxide protective window layer may be performed either before or after the step of forming a P-N junction.

The method may further comprise the step of first forming the silicon dioxide protective window layer on a sacrificial substrate prior to forming the P-N junction on the silicon dioxide protective layer

BRIEF DESCRIPTION OF THE FIGURES

For a better understanding of the present invention, together with other and further aspects thereof reference is made to the following description taken in conjunction with the accompanying figures of the drawing, wherein:

FIGS. 5A-5C depict architectural solar cell embodiments wherein a high-transparency amorphous silica (silicon dioxide) window layer is used as a substrate upon which a photovoltaic P-N junction is subsequently formed; and FIGS. 6A-6B depict architectural solar cell embodiments wherein nano-particle P-N junctions are embedded in one or more layers of transparent conducting oxides formed on a window layer of high transparency amorphous silica.

DETAILED DESCRIPTION OF THE INVENTION

This application incorporates by reference all matter contained in co-pending U.S. patent application Ser. No. 11/243,422, filed Oct. 3, 2005 and entitled "CERAMIC ANTENNA MODULE AND METHODS OF MANUFACTURE THEREOF" (the '422 application), Ser. No. 11/479,159, filed Jun. 30, 2006 and entitled "ELECTRICAL COMPONENT AND METHOD OF MANUFACTURE" (the '159 application), and Ser. No. 11/620,042, filed Jan. 6, 2007 and entitled "POWER MANAGEMENT MODULES AND METHOD OF MANUFACTURE" (the '042 application). In the '422 application, de Rochemont, discloses articles and methods that are used to form silicon dioxide-based layers and metamaterial bodies on the surface of a semiconductor die using low-temperature liquid or powder aerosol sprays.

Photovoltaic (PV) cells, more popularly known as solar cells, convert sunlight to direct current (DC) electrical energy that can be used to charge batteries, power a variety of microelectronic devices, or drive DC motors. PV systems can also be configured with power inverters to deliver alternating current (AC) electrical energy that is compatible with the function of an electrical utility grid used to drive the operation of general electrical appliances.

The output power generated by a PV device is directly proportional to its circuit efficiency and physical size. Cell circuit efficiency will be affected by the integrity of one or more P-N junctions formed within silicon semiconductor and the total amount of sunlight transmitted to that interface.

High power PV modules comprise multiple PV cells sealed in an environmentally protective laminate. Therefore methods and material compositions that provide a means to form a mechanically hard, high transparency, low-reflectance protective laminate over large surface areas without altering the integrity of an electrical interface forming a P-N junction are desirable.

Reference is now made to FIGS. 1, 2A and 2B, which describe a photovoltaic (PV) device 101 and PV module 111 consisting of a semiconductor 103, comprising an ultra-thin layer of N-type semiconductor 105 in direct electrical contact with a P-type semiconductor layer 107, with an environmentally protective laminate 109. A PV module 111 comprises an array of discrete PV devices 113 that are electrically connected in series and/or in parallel through a wiring harness 115 to generate higher currents, voltages, and power levels. In the case of the PV module 111, it is desirable to apply the environmentally protective laminate 117 to the entire assembly and encapsulate the entire panel 119.

Within each PV device 101/113, an intrinsic electrical field is generated at the electrical interface 121 that forms the P-N junction between the doped semiconductor layers. The region in which the intrinsic electrical field is contained is depleted of conductive charges. Incident sunlight penetrating the surface of the PV cell will stimulate conduction electrons within the P-N junction's depletion zone. The intrinsic electrical field imparts directional momentum to the light-stimulated electrical charge when the PV device is connected to an electrical load in electrical communication with conductive electrodes 122A, 122B located on opposite sides of the electrical interface 121 forming the P-N junction. The strength of the intrinsic electrical field and device efficiency are directly proportional to the P-N junction's doping profile and the quantity of light energy penetrating into the depletion region. It is therefore desirable to avoid exposing the semiconductor 103 to process temperatures (>600° C.) that would stimulate thermally-activated diffusion processes within and between the doped layers and degrading the dopant profile forming the P-N junction. It is also desirable to utilize an ultra-high transparency window material as the encapsulation layer Silicon dioxide is a highly desirable material for use as an encapsulation layer. It has high optical transparency ranging from near-infrared, across the visible, and into the near ultraviolet optical spectrum, which makes it useful for multi-junction PV devices. It is mechanically hard and has an excellent coefficient of expansion match with silicon. However, conventional methods used to apply silicon dioxide to the surface of a silicon PV device impose limitations harmful to device performance. The historical method, which forms silicon dioxide surface layers by flowing de-ionized water vapor over a silicon surface heated to temperatures exceeding 850° C. degrades the dopant profile in the ultra-thin phosphorous-doped layer. Spin-on glass (SOG) techniques spin-coat a liquid film layer of metalorganic precursors that is subsequently converted into silicon dioxide by low-temperature heat treatment (350-600° C.). The heat treatment converts the metalorganic compounds into silicon dioxide by thermal pyrolysis. While the SOG methods are suitable for producing high-quality silicon dioxide films, individual SOG layer thickness is typically much less than 1 micron, which is not sufficiently thick for use as an environmentally protective laminate. Multiple layers can be built up using the SOG technique, however, this approach is not efficient from a manufacturing perspective, and can not be used in non-planar PV module assemblies that might include assembly components 123 that frame individual PV devices 113 within the PV module 119.

In one embodiment, amorphous silicon dioxide is deposited on the surface of a semiconductor wafer at low temperatures (<430° C.) using liquid aerosol sprays. Liquid aerosols comprise a metalorganic solution of silicon precursors that can be applied at atmospheric pressures with a controlled-gas ambient. This method is preferred because its ability to deposit high quality silicon dioxide layers to arbitrary thicknesses at atmospheric pressures is easily adapted to high productivity manufacturing environments. A variety of aerosolizing techniques can be applied to form an aerosol spray from the liquid precursor solution. While other nebulization methods, (such as ultrasonic and thermo-resistive heating techniques, among others), can be used to form the aerosol spray, the use of pressurized resonant air-cavity nozzles is the preferred technique to blanket coat large surface areas because of its ability to aerosolize high viscosity solutions and to establish reactive-gas atmospheres that influence the dynamics of efficient precursor decomposition.

The silicon dioxide is deposited on to the surface of a semiconductor wafer at low temperatures (<430° C.) using liquid aerosol sprays. Liquid aerosols comprise a metalorganic solution of silicon precursors that can be applied at atmospheric pressures with a controlled-gas ambient. This method is preferred because its ability to deposit high quality silicon dioxide layers to arbitrary thicknesses at atmospheric pressures is easily adapted to high productivity manufacturing environments. A variety of aerosolizing techniques can be applied to form an aerosol spray from the liquid precursor solution. While other nebulization methods, (such as ultrasonic and thermo-resistive heating techniques, among others), can be used to form the aerosol spray, the use of pressurized resonant air-cavity nozzles is the preferred technique to blanket coat large surface areas because of its ability to aerosolize high viscosity solutions and to establish reactive-gas atmospheres that influence the dynamics of efficient precursor decomposition.

Figure 3:
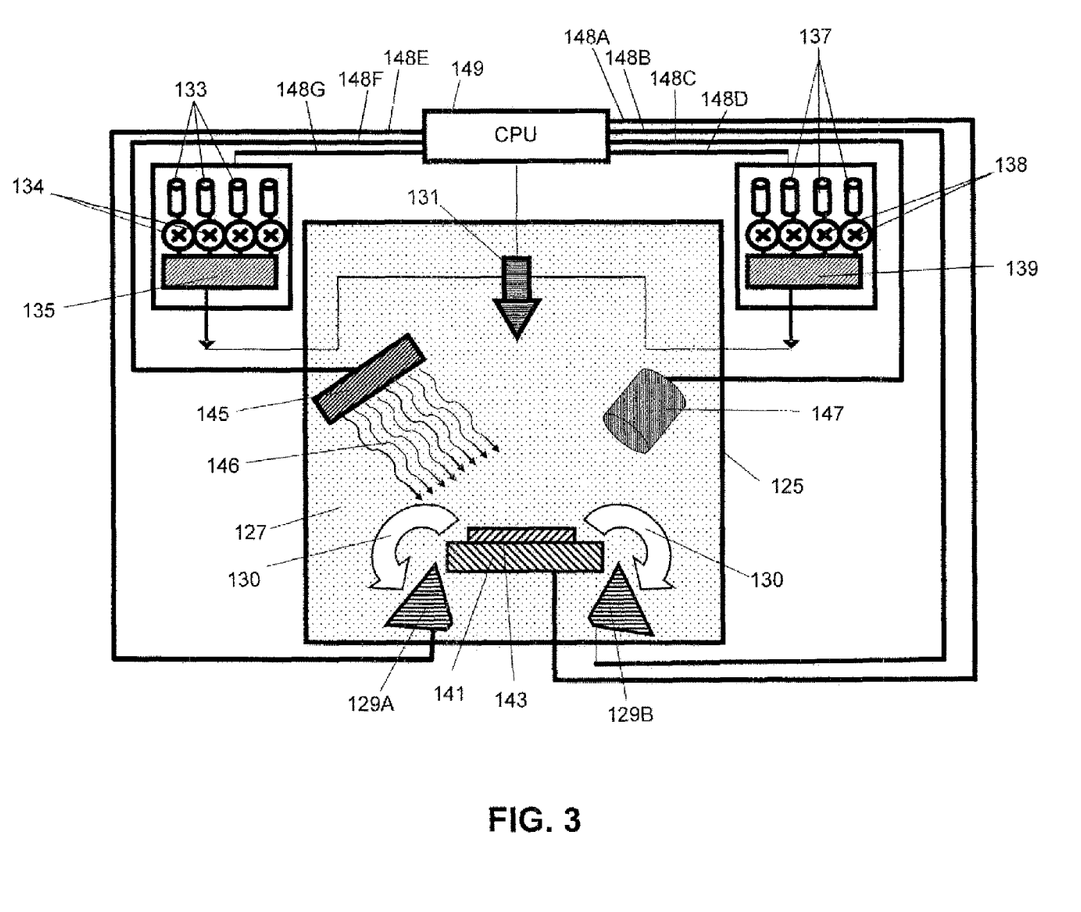
FIG. 3 is a schematic representation of a deposition chamber configured to spray a liquid aerosol of encapsulating silicon dioxide.

Making reference to FIG. 3, a liquid aerosol spray station consists of a deposition chamber 125 filled to atmospheric pressure with air or a controlled mixture of inert and process gases 127, exhaust vents 129 that are used to draw 130 vaporized waste products out of the deposition chamber 125, at least one spray nozzle 131 that is supplied with one or more process gases 133 that have pressure and flow rates regulated by mass flow controllers 134. It is preferred to mix the process gases in a gas manifold 135 before supplying them to the spray nozzle(s) 131. The gas manifold 135 is used to regulate a gas mixture consisting of an inert gas carrier (for instance, dry nitrogen, argon, helium, among others), and an oxidizing agent (such as oxygen or a mixture of carbon monoxide and carbon dioxide). The oxidizing agent should have a partial pressure that ranges between 0.05% and 20%, preferably 2-10% of the inert carrier gas.

The spray nozzle(s) 131 is (are) additionally supplied by one or more liquid precursors 137 and the precursor flow rate delivered to the spray nozzle is regulated by one or more mass flow controllers 138. The precursor delivery system may optionally include a liquid manifold 139 that is used to blend individual liquid precursors in a controlled manner to introduce a compositional gradient that varies a physical property of the silicon dioxide deposit, such as the refractive index gradient, with layer thickness to enhance the deposited layer's anti-reflective properties.

The deposition chamber 125 contains a heated pedestal 141 upon which the silicon dioxide is formed on the PV device 143 or substrate as the case may be. The chamber may optionally include infrared or ultraviolet lamps 145, such as an excimer lamp, that expose the sprayed deposits to radiant wavelengths 146 that improve precursor decomposition processes. Additionally, a pyrometer 147, or similar thermally sensing device, is used to measure the surface temperature of the article upon which the silicon dioxide film is deposited.

Figure 4:
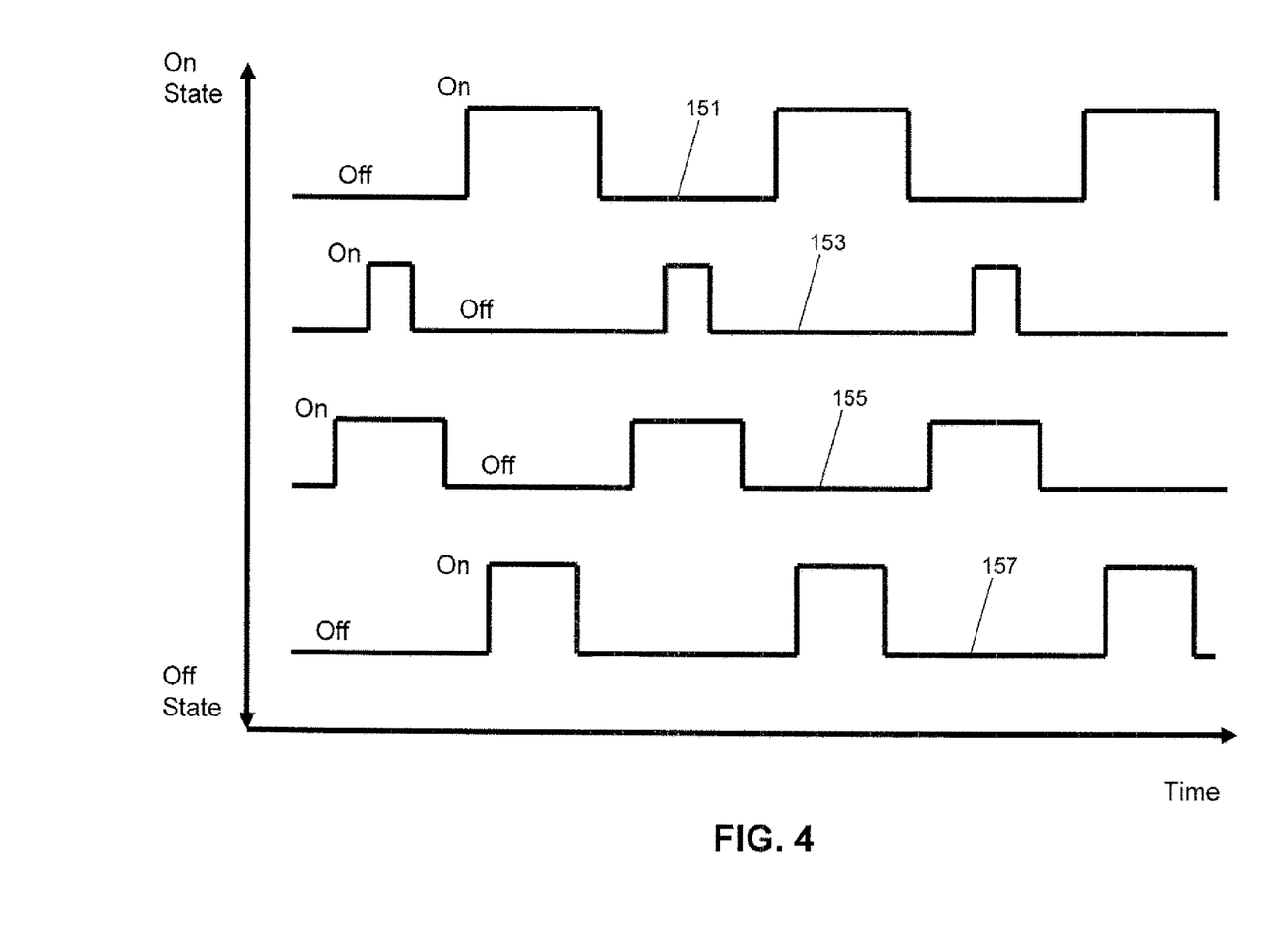
FIG. 4 provides characteristic sequencing of control parameters used to deposit amorphous silica.
Figure 5A:
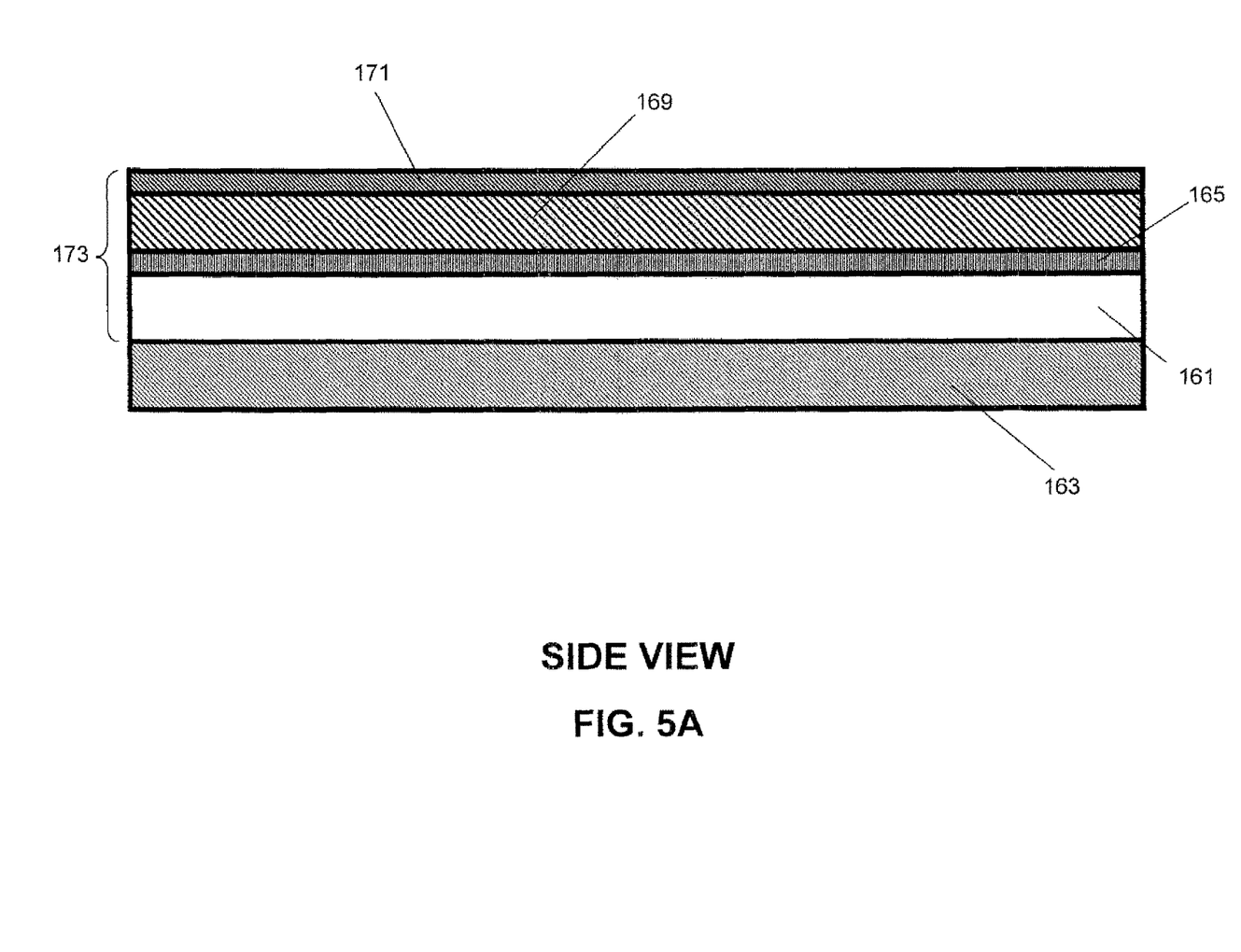
Figure 5B:
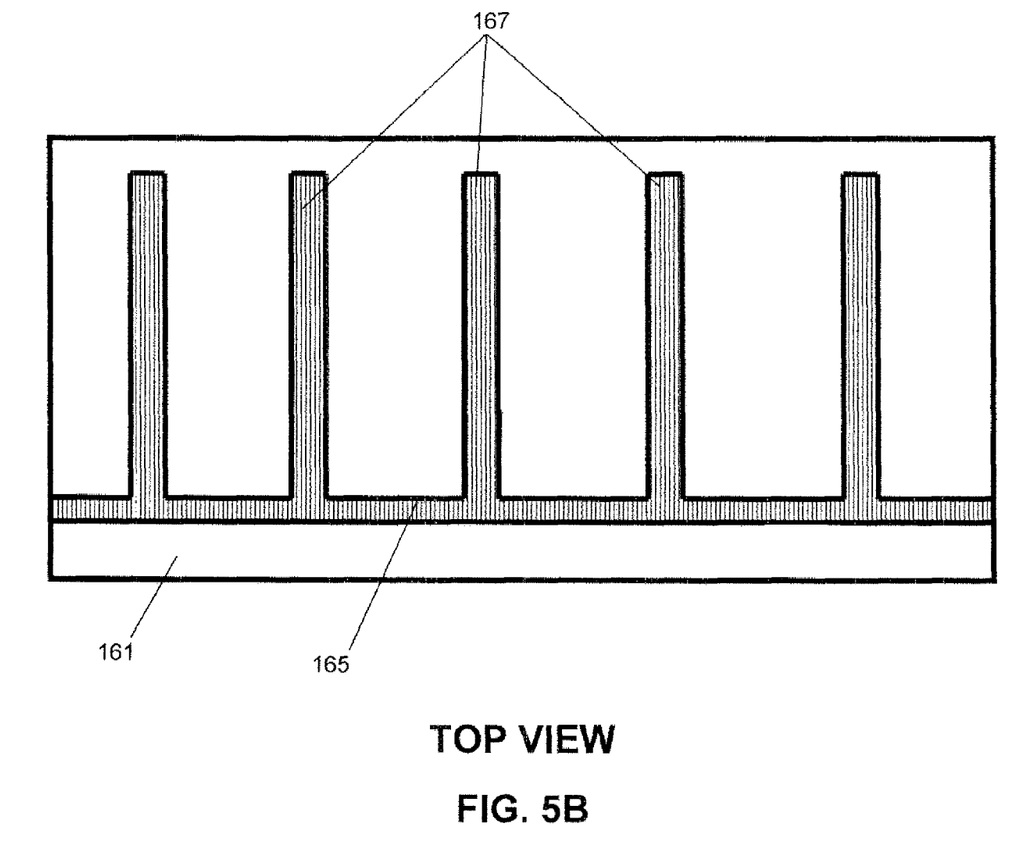
Figure 5C:
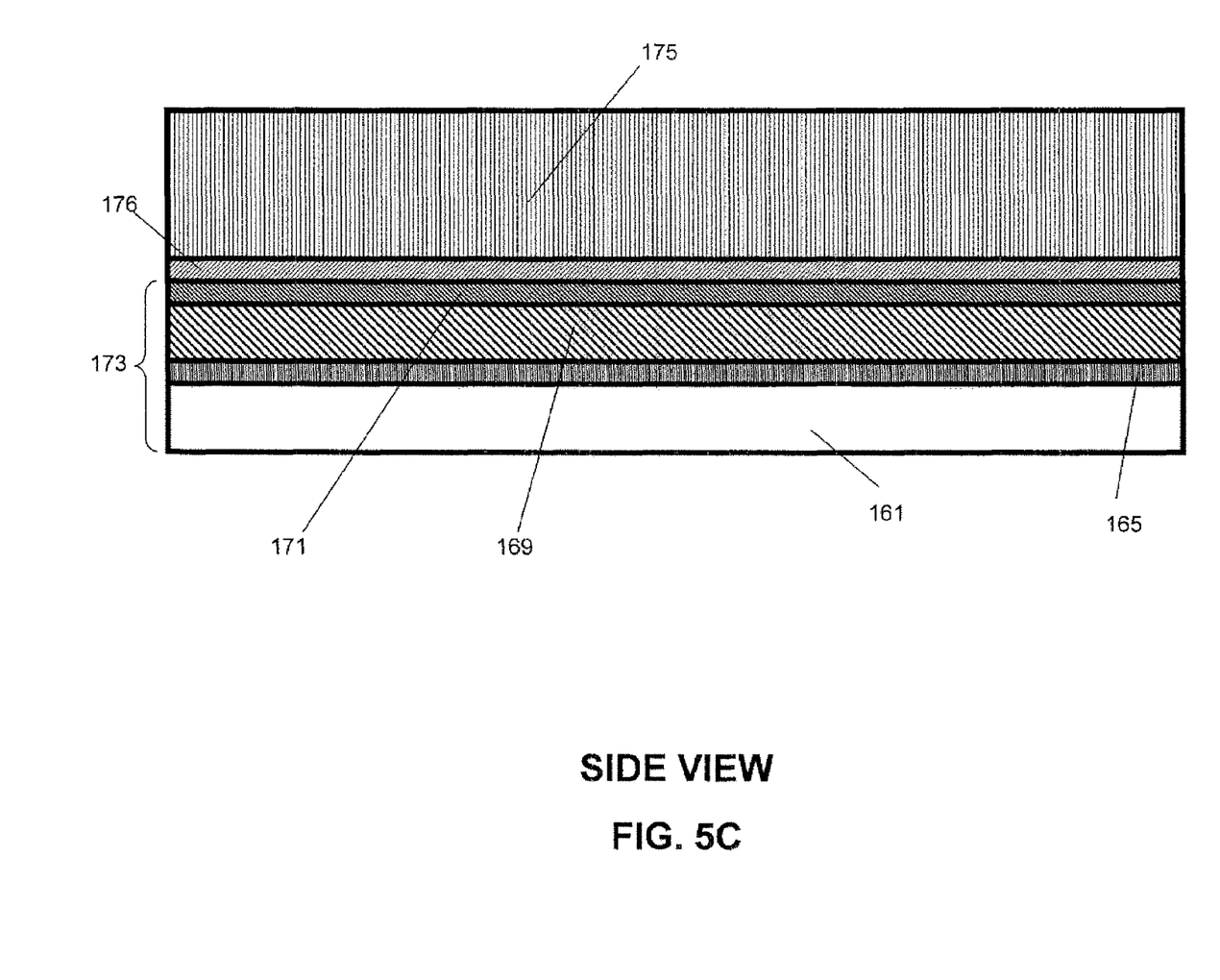

Control loops 148A, 148B, 148 C, 148 D, 148E, 148F, 148G managed by a central processing unit (CPU) 149 may be used to control process parameters. Control of deposition temperature may be accomplished by regulating the surface temperature of the substrate or PV device 143. FIG. 4 shows a time chart of how certain process parameters may be pulsated during the deposition process in a coordinated fashion by CPU 149, including the chamber exhaust 151, liquid precursor feed 153, gas feed 155, and UV lamp exposure 157.

Figure 1:
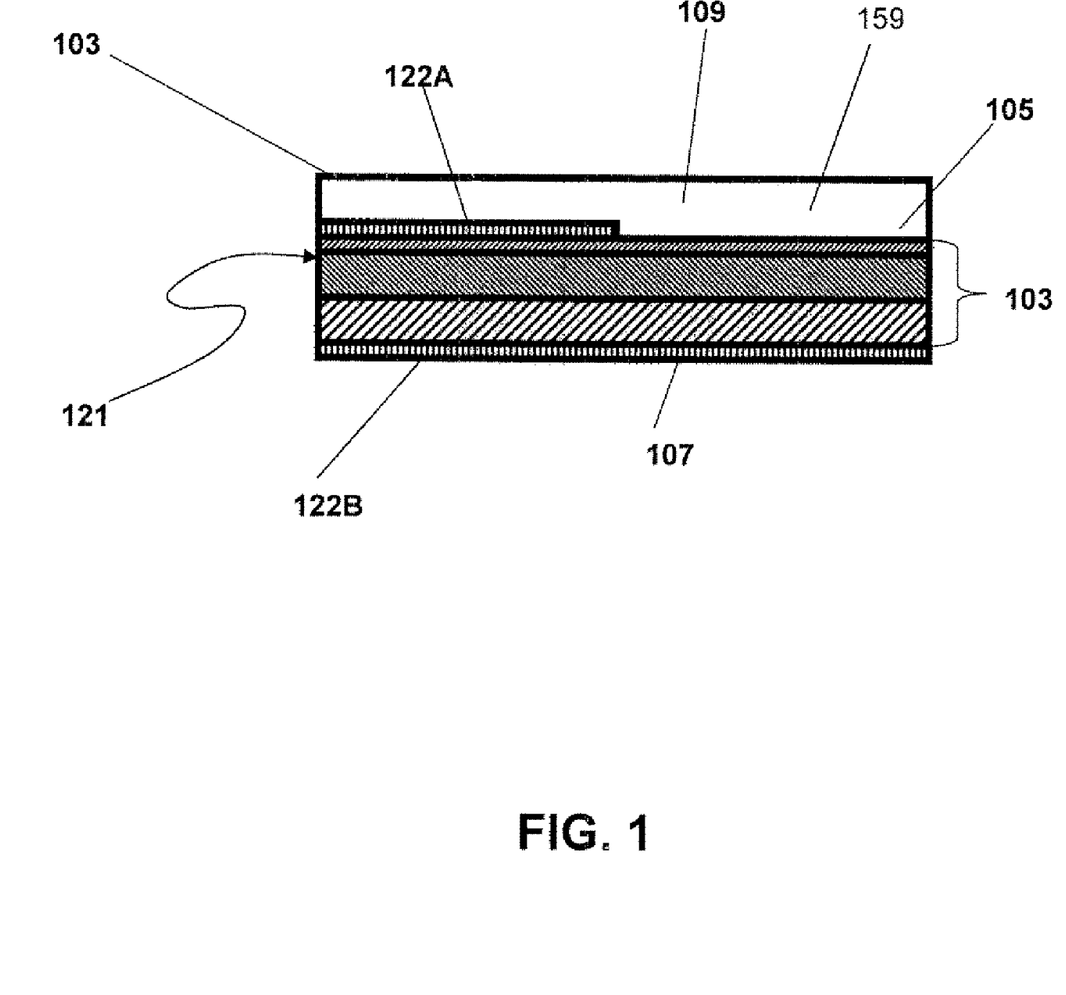
FIG. 1 depicts the layered structure of a photovoltaic (PV) device.
Figure 2A:
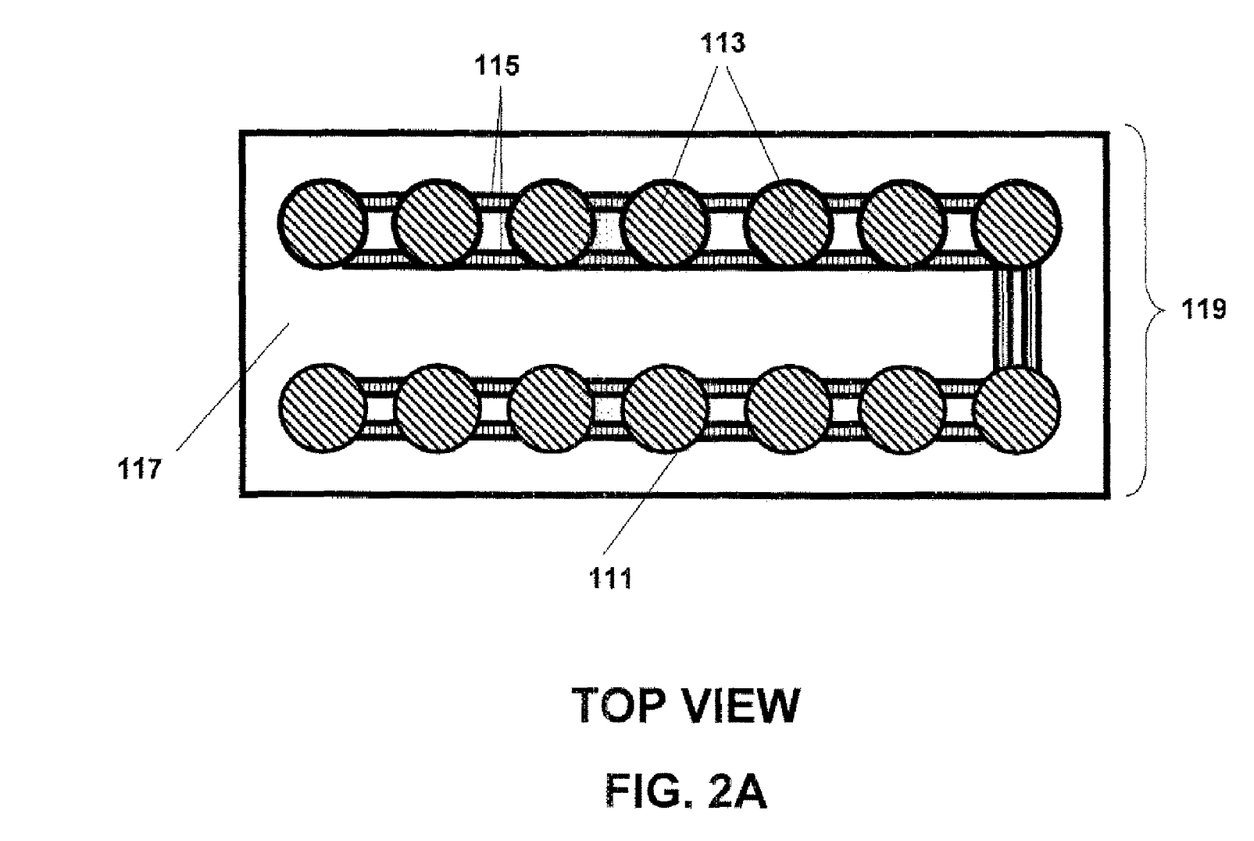
FIGS. 2A-2B depict TOP and SIDE VIEWS of a photovoltaic (PV) module.
Figure 2B:
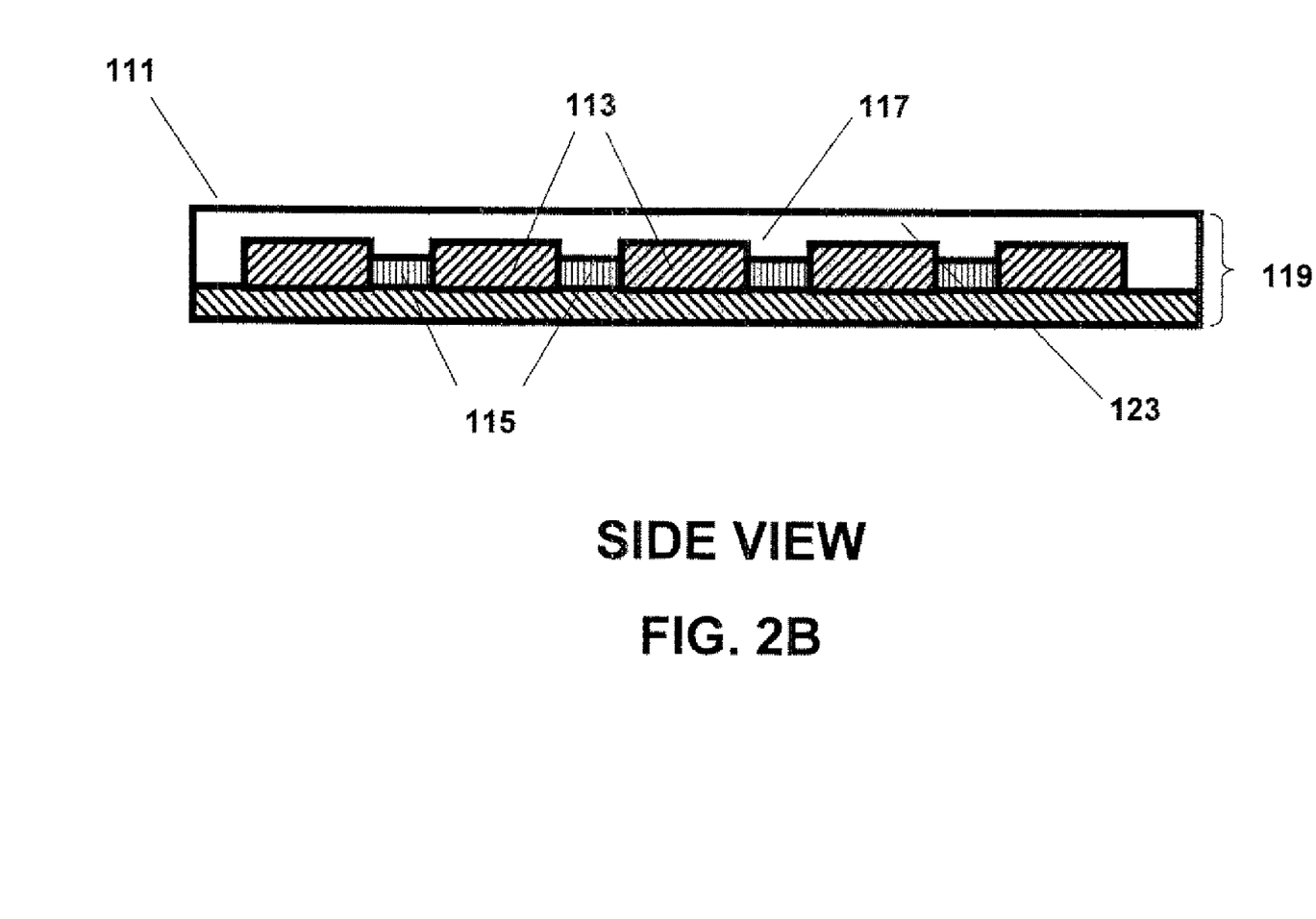

An embodiment of the invention forms the silicon dioxide encapsulation layer 159 directly on the surface of semiconductor layer 103 adjacent to the P-N junction as shown in FIG. 1. The electrical interface 121 of the P-N junction need not be planar as depicted, and could, in fact, have any topology demonstrated to improve photovoltaic efficiency. Reference is now made to FIGS. 5A, 5B, 5C and 6A, 6B to illustrate another embodiment of the invention, wherein liquid aerosol spray deposition forms an encapsulating high-transparency amorphous silica layer 161 having thickness ranging between 1 micron and 1 centimeter or more, preferably thickness ranging from 250 micron to 1 millimeter or more, on the surface of a sacrificial substrate 163. A first conducting medium 165 is then applied to the surface to the encapsulating amorphous silica layer to function as an electrode for the PV device. The first conducting medium 165 may be a transparent oxide layer, for instance, an indium-tin oxide layer formed using liquid aerosol spray deposition, or it may comprise an array of thin metallic fingers 167 patterned on the surface so as not to obscure light transmission into additional layers applied to its surface, At least one semiconductor absorbing layer 169, constructed to function as a photovoltaic device, is applied to the surface of the amorphous silica layer 161 and the conducting medium 165. Copper indium gallium selenide (CIGS) is a preferred semiconductor compound for its intrinsic ability to function as a glass tint and to form a nanoscale "percolation network" that accelerates the transfer of electrons generated by light energy absorbed in the semiconductor absorbing layer 169. A second conducting medium 171 is applied to the surface of the semiconductor absorbing layer 169 to function as a second electrode for the PV device. Although this second conducting medium 171 does not need to be transparent, a transparent conducting medium is preferred when the photovoltaic structure is to be used as a tinted solar cell window or as a sheet of architectural glass. In this instance, the second conducting medium 171 may comprise a semi-transparent metallic film, a transparent oxide, or a transparent electrically conducting polymer. A pane of tinted solar cell window or architectural glass 173 is competed by separating the high-transparency amorphous silica layer 161 from the sacrificial substrate 163 thereby exposing the amorphous silica layer 161 as a high transparency protective layer maximizing the quantity of light energy allowed to penetrate into the semiconductor absorbing layer 169. An alternative preferred embodiment for use as a tinted solar cell window or pane of architectural glass attaches a thick pane of lower cost float glass 175 (FIG. 5C) to the multilayer structure forming the tinted solar cell window or architectural glass 173 through a transparent adhesive layer 176, preferably a transparent polymer adhesive, to mechanically reinforce the structure.

Figure 6A:
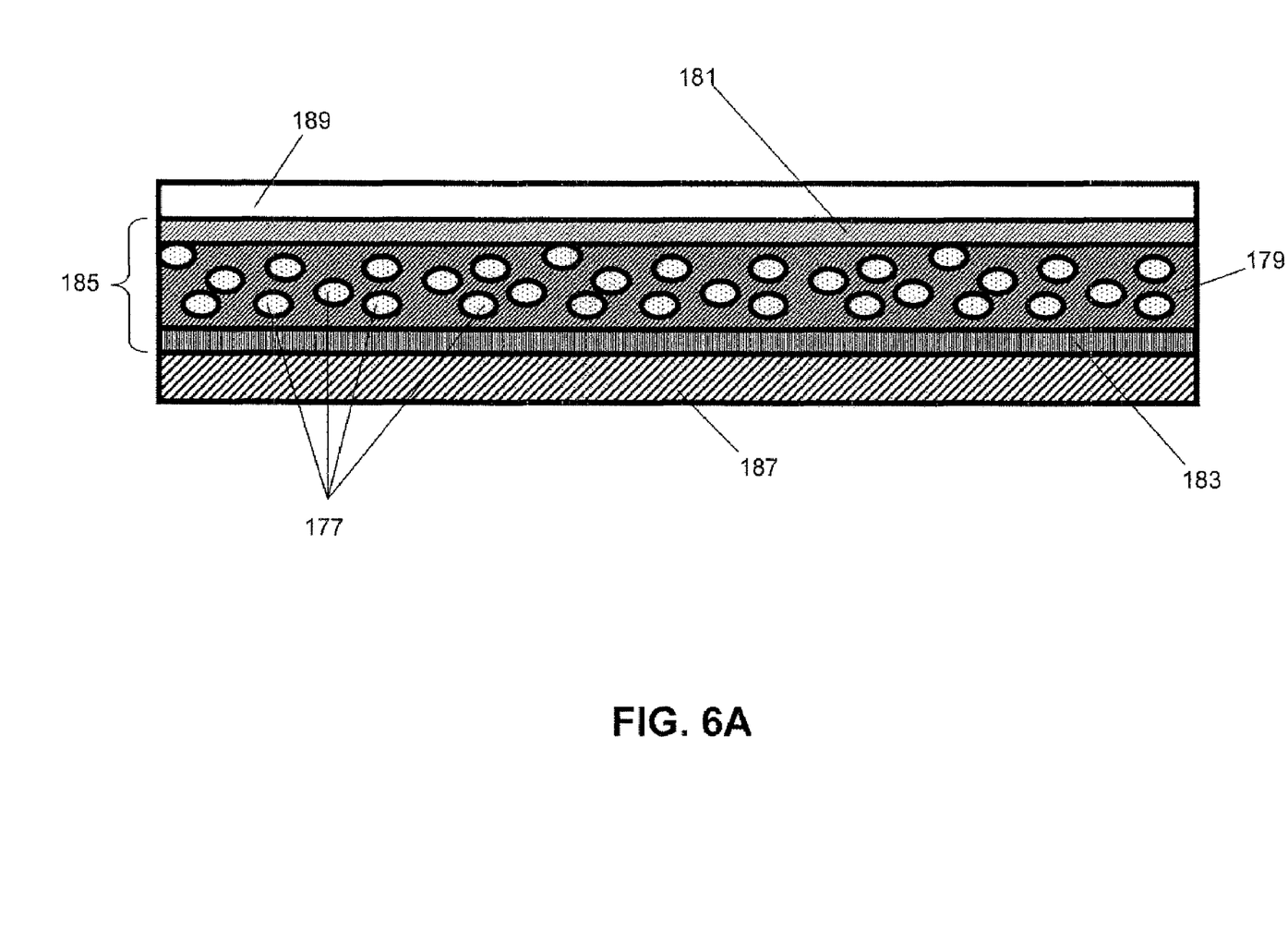
Figure 6B:
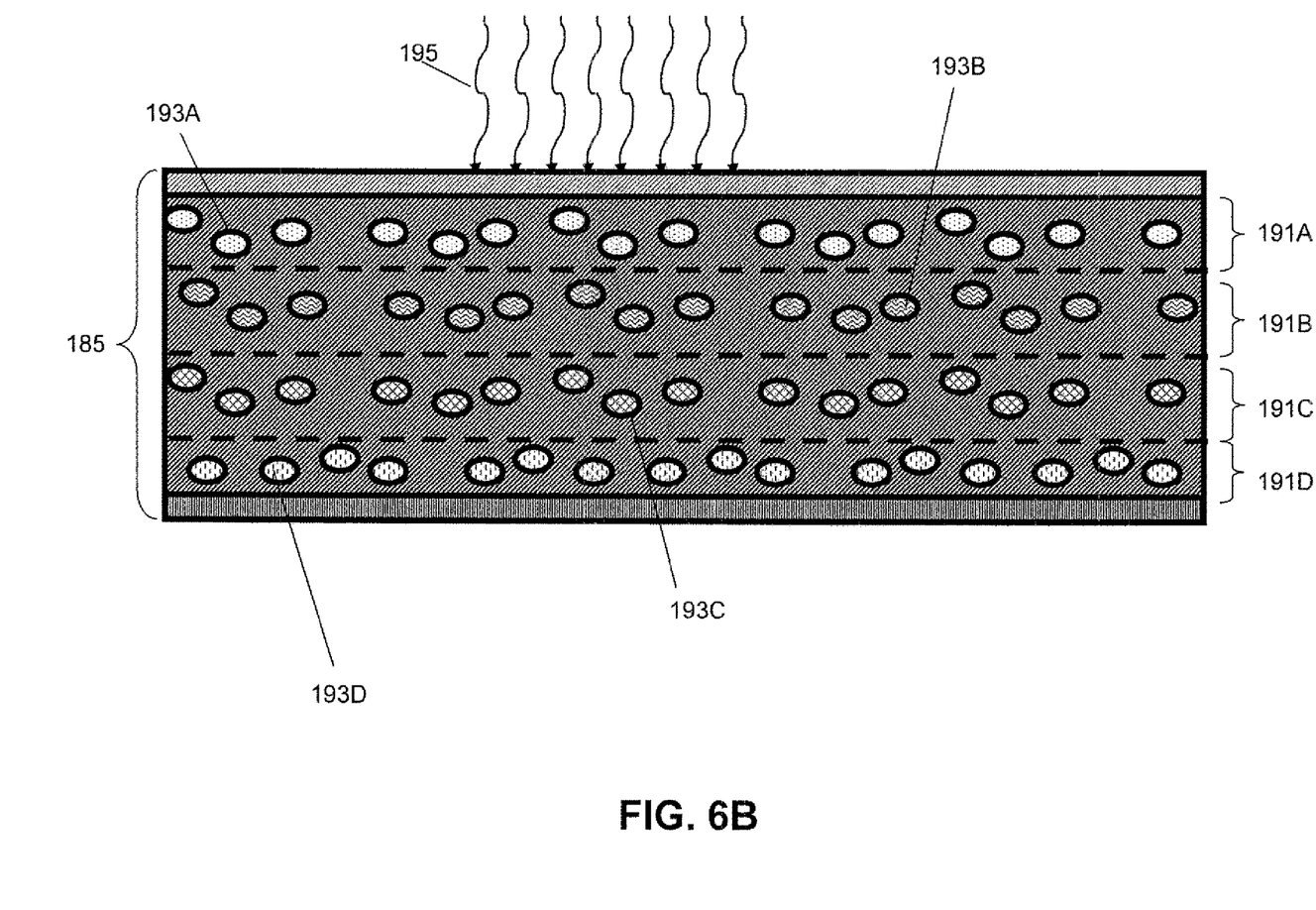

An alternative preferred embodiment of the present invention, depicted in 6A, 6B, utilizes liquid aerosol sprays to embed absorbing semiconductor nanoparticles 177, wherein each nanoparticle comprises a nanoscale P-N junction, within a transparent conducting oxide layer 179, such as an indium-tin oxide layer. A first conducting medium 181 and a second conducting medium 183 are attached to the transparent conducting oxide layer 179 to make electrical contact with the nanoparticle P-N junctions 177 embedded within the transparent conducting layer 179. The nanoparticle P-N junctions are formed from semiconductor compounds that can withstand spray deposition temperatures in the range of 200° C. and 430° C., such as gallium arsenide (and other suitable III-V compound semiconductors), cadmium telluride (and other suitable II-VI compound semiconductors), silicon, silicon-germanium, germanium, and diamond (Group IV semiconductor compounds). It is well known to practitioners skilled in the art that the semiconductor band gap energy of these compounds can be tuned over the optical, near-infrared and far-infrared regions of the electromagnetic spectrum by blending different elements from columns II, III, IV, V and VI of the periodic table. The nanoparticle P-N junctions are dispersed as a colloidal suspension in a liquid precursor solution needed to form the transparent conducting medium as instructed by the de Rochemont '715 and '432 patents. The nanoparticle photovoltaic device 185 may be optionally attached to a mechanical reinforcing layer 187 or a high transparency amorphous silica layer 189 as discussed above.

Alternatively, the nanoparticle photovoltaic device may comprise multiple nanoparticle layers 191A, 191B, 191C, 191D (FIG. 6B), wherein each nanoparticle layer contains absorbing semiconductor nanoparticles having different semiconductor band gap energies to form a multi-color solar cell device. Conductive charged particle pairs (negatively charged electrons and positively charge holes) are created within a semiconductor when it absorbs light energy equal to or greater than the semiconductor band gap energy. Electron-hole pairs generated in a charge-depleted region of the semiconductor are swept by strong internal electric fields to generate the photovoltaic response. Multi-color solar cell devices would comprise a set of nanoparticle P-N junctions formed from semiconductor compounds having band gap energies corresponding to different regions of the electromagnetic spectrum. For instance, semiconductor nanoparticles absorbing light energy having electromagnetic wavelengths that are in the order of 400 nm would be absorbing predominantly violet colors, whereas nanoparticles absorbing light energy having electromagnetic wavelengths that are on the order of 800 nm and 1-2 microns would be absorbing predominantly red and near-infrared colors. In this instance, it is preferred to position the layer comprising absorbing semiconductor nanoparticles having the widest band gap (absorbing the shortest wavelength of light energy) corresponding to light energy with wavelengths ranging from 500 nm to 400 nm or more, 193A as the nanoparticle layer upon which incident light energy 195 will enter the multi-layer structure, and to progressively position, as the case may be, nanoparticle layers 191B, 191C, 191D, in order of decreasing nanoparticle 193B, 193C, 193D band gap energy such that the nanoparticles with smallest band gap energy 193D (absorbing the longest wavelength of light energy) corresponding to light energy with wavelengths ranging from 1.5 micron to 800 nm is located furthest away from the incident light energy source 195.

Although the invention has been described with respect to various embodiments, it should be realized this invention is also capable of a wide variety of further and other embodiments within the spirit and scope of the appended claims.

What is claimed is:

1. An architectural photovoltaic window, comprising:
    a first protective window layer;
    first transparent electrical contacts formed on the first protective window layer;
    a P-N junction formed between doped semiconductor materials on the first protective window layer and the first transparent electrical contacts, wherein the P-N junction is adapted to produce photovoltaic current in response to radiant energy reaching the P-N junction;
    second transparent electrical contacts formed on one or more of the doped semiconductor materials; and
    a second protective window layer of 250 microns thickness or more formed of amorphous silica on one or more of the doped semiconductor materials and the second transparent electrical contacts, using a liquid aerosol spray of one or more metalorganic precursors at formation temperatures less than 600° C., wherein the second protective window layer is adapted to allow radiant energy to pass therethrough en route to the P-N junction, the second protective window layer including a high optical transparency layer of amorphous silica, having a silicon dioxide chemistry greater than 75 molar percent.

2. The window of claim 1, wherein the one or more semiconductor materials have an non-planar surface on which the second transparent electrical contacts and the second protective window are formed.

3. A method for fabricating an architectural photovoltaic window, comprising the steps of:
    forming a P-N junction between doped semiconductor materials on a first protective window layer, wherein the P-N junction is adapted to produce photovoltaic current in response to radiant energy reaching the P-N junction; and
    forming a second protective window layer of 250 microns thickness or more of amorphous silica on one or more of the doped semiconductor materials, using a liquid aerosol spray of one or more metalorganic precursors at formation temperatures less than 600° C., wherein the second protective window layer is adapted to allow radiant energy to pass therebrough en route to the P-N junction, the second protective window layer including a high optical transparency layer of amorphous silica, having a silicon dioxide chemist greater than 75 molar percent.

4. The method of claim 3, further comprising the step of forming the first protective window layer using a liquid aerosol spray of one or more metalorganic precursors at formation temperatures less than 600 C., wherein the first protective window layer is 250 or more microns thick.

5. The method of claim 3, further comprising the step of forming first transparent electrical contacts on the first protective window layer prior to the step of forming a P-N junction, and forming second transparent electrical contacts on one or more of the semiconductor materials prior to the step of forming the second protective window layer.

6. The method of claim 3, wherein the second protective window layer is formed on a non-planar surface of the one or more semiconductor materials.

7. The method of claim 3, wherein the step of forming a P-N junction uses semiconductor nanoparticles in a transparent conducting oxide.

* * * * *